United States Patent [19]
Bereza

[11] Patent Number: 5,734,279
[45] Date of Patent: Mar. 31, 1998

[54] CHARGE PUMP CIRCUIT

[75] Inventor: William Bereza, Nepean, Canada

[73] Assignee: Northern Telecom Limited, Montreal, Canada

[21] Appl. No.: 745,170

[22] Filed: Nov. 7, 1996

[51] Int. Cl.$^6$ .................................................. H03K 3/00
[52] U.S. Cl. ........................ 327/112; 327/108; 327/111; 327/157
[58] Field of Search ................... 327/108, 111, 327/112, 536, 537, 538, 589, 148, 157

[56] References Cited

U.S. PATENT DOCUMENTS

| 5,144,156 | 9/1992 | Kawasaki | 327/157 |
| 5,334,951 | 8/1994 | Hogeboom | 331/1 A |
| 5,517,142 | 5/1996 | Jang et al. | 327/108 |
| 5,592,120 | 1/1997 | Palmer et al. | 327/536 |
| 5,656,960 | 8/1997 | Holzer | 327/108 |

*Primary Examiner*—Timothy P. Callahan
*Assistant Examiner*—Jung Ho Kim
*Attorney, Agent, or Firm*—Angela C. de Wilton

[57] ABSTRACT

A charge pump circuit includes a current mirror circuit of current-sourcing and current-sinking FETs and a current steering circuit of cross coupled differential pairs of FETs. Nominal current flowing in the current-sourcing and current-sinking FETs is set. The current is for charging and discharging a capacitor of an external filter. During charging of the filter capacitor, the current through the current-sourcing FET is directed to the capacitor and the current through the current-sinking FET is directed from a low impedance voltage source. During discharging of the filter capacitor, the current through the current-sourcing FET is directed to the low impedance voltage source and the current through the current-sinking FET is directed from the capacitor. The current flowing in the current-sourcing and current-sinking FETs is nominally constant, regardless of the tri-state condition, charging or discharging, with the result that power supply noise is reduced. Current change in the power supply rails is reduced when switching from current-sourcing to current-sinking or vice versa. By using cascode FETs in both of the current-sourcing and current-sinking FET circuits, power supply noise rejection is improved.

20 Claims, 3 Drawing Sheets

CHARGE PUMP CIRCUIT

FIELD OF THE INVENTION

This invention relates to a charge pump circuit, with particular application to a phase locked loop circuit.

BACKGROUND OF THE INVENTION

A known phase locked loop (PLL) configuration including a voltage controlled oscillator (VCO), a phase detector, a charge pump circuit and a capacitive filter is disclosed in U.S. Pat. No. 5,334,951 granted to J. G. Hogeboom on Aug. 2, 1994. The prior art charge pump circuit shown in FIG. 2 of the patent is based on a current mirror circuit which includes series-connected field effect transistors (FETs) as switching devices. A VCO signal and an input signal are fed to the phase detector which detects the phase difference between both signals. The phase detector generates two pulse trains responsive to the phase difference. The pulse trains cause the switching FETs to turn-on and -off. In response to one of the pulse trains, the current mirror circuit sources current to the filter via the on-switching FET and, in response to the other pulse train, the current mirror circuit sinks current from the filter via the on switching FET. As a result, the filter is charged or discharged and the voltage in the filter is fed to the VCO to variably control the frequency of the VCO signal. The FETs' switching operation of turn-on and -off causes noise on the power supply rails and current spikes. The noise directly affects the VCO frequency and the current spikes affect the PLL operation.

SUMMARY OF THE INVENTION

It is an object to provide an improved charge pump circuit, which seeks to avoid or overcome the aforementioned problems.

According to one aspect of the present invention, there is provided a charge pump circuit comprising: first, second and third voltage terminals for receiving first, second and third voltages, respectively, the third voltage being at a level between the first and the second voltages; current means connected to the first and second voltage terminals and having first and second current terminals, the current means being capable of sourcing current to the first current terminal and sinking current from the second current terminal in response to an input signal; a load terminal for connection to a load; and current steering means connected to the third voltage terminal, the load terminal, the first current terminal and the second current terminal, the current steering means operable: (i) in a current-source mode, to direct current from the first current terminal to the load terminal and to direct current from the third voltage terminal to the second current terminal; and (ii) in a current-sink mode, to direct current from the load terminal to the second current terminal and to direct current from the first current terminal to the third voltage terminal.

In an example, the current means comprises: current sourcing means capable of sourcing current to the first current terminal in response to the input signal; and current sinking means capable of sinking current from the second current terminal in response to the input signal. The current sourced by the current sourcing means is directed to the load terminal and the third voltage terminal by the current steering means in the current-source and the current-sink modes, respectively. The current sinking means sinks the current from the third voltage terminal and the load terminal directed by the current steering means in the current-source and the current-sink modes, respectively.

Due to control of the current direction by the current steering means, the current means causes current to flow in both of the current-source and the current-sink modes and thus current changes are reduced, so that noise through the voltage source is reduced.

BRIEF DESCRIPTION OF THE DRAWINGS

Embodiments of the present invention will now be described by way of example with reference to the accompanying drawings in which.

DETAILED DESCRIPTION

I. Prior Art

Figure 1:
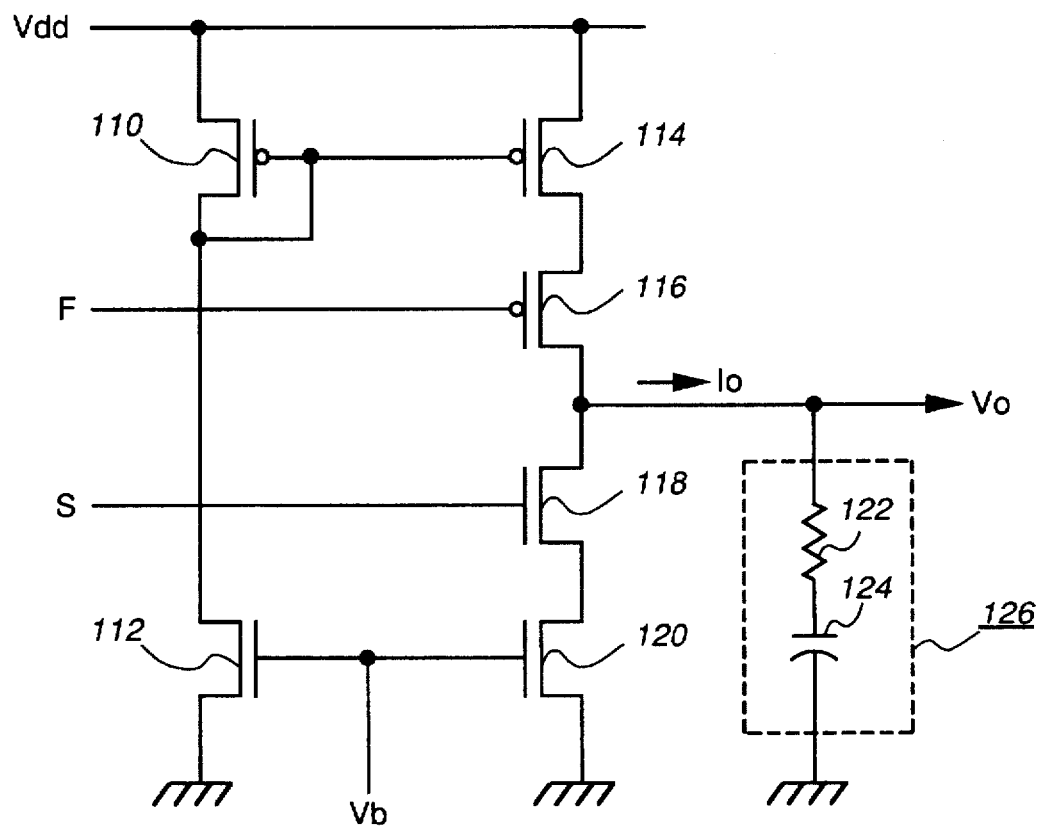
FIG. 1 is a schematic diagram of a prior art charge pump circuit.

Referring to FIG. 1, which shows a prior art charge pump circuit using a mirror circuit, a P-channel FET 110 and an N-channel FET 112 are connected in series between the supply voltage terminal of a positive voltage Vdd and the ground terminal. Also, two P-channel FETs 114 and 116 and two N-channel FETs 118 and 120 are connected in series between the supply voltage terminal and the ground terminal. The gate of the FET 114 is connected to the gate and drain of the FET 110. The gate of the FET 120 is connected to the gate of the FET 112. The junction of the drains of the FETs 116 and 118 is connected to an output terminal of the charge pump circuit. A series-connected resistor 122 and capacitor 124, which form a filter network 126, are connected between the output terminal and the ground terminal.

In response to an input voltage Vb fed to the gates of the FETs 112 and 120, current flows in the series-connected FETs 110 and 112 and mirrored current flows in the FETs 114–120 when the FETs are on. The charge pump circuit is used in a conventional PLL including a VCO (not shown) and a phase detector (not shown). Pulse trains F and S are provided from the phase detector in response to the phase difference between an input signal and the VCO signal and are fed to the gates of the FETs 116 and 118, respectively. The charge pump circuit is a switched current source responsive to the pulse trains F and S to apply a charge (i.e., current Io) indicative of the phase difference to the filter network 126. Application of that charge to the filter network 126 develops a control voltage Vo across the filter network 126. The output voltage Vo is applied to the VCO to control the frequency of the output signal. Detailed operation of the charge pump circuit is described in U.S. Pat. No. 5,334,951 granted to J. G. Hogeboom on Aug. 2, 1994, which is hereby incorporated by reference.

In the circuit shown in FIG. 1, when, in response to the pulse train F, the charge pump circuit provides the current Io to the filter network 126 (in a charge or current-source mode), no current flows through the FET 120. On the other hand, when, in response to the pulse train S, the FET 120 takes current (in a discharge or current-sink mode), no current flows through the FET 114. Accordingly, the FETs 114, 116 and 118, 120 are turned on and off in response to the pulse trains F and S. The FET switching causes spikes due to large changes in current, which can produce detrimental effects in normal PLL operation.

II. Embodiments

The following description assumes, for simplicity and purely by way of example, that the FETs referred to are MOSFETs (metal oxide semiconductor field effect transistors).

II-1. First Embodiment a) Structure of the First Embodiment

Figure 2:
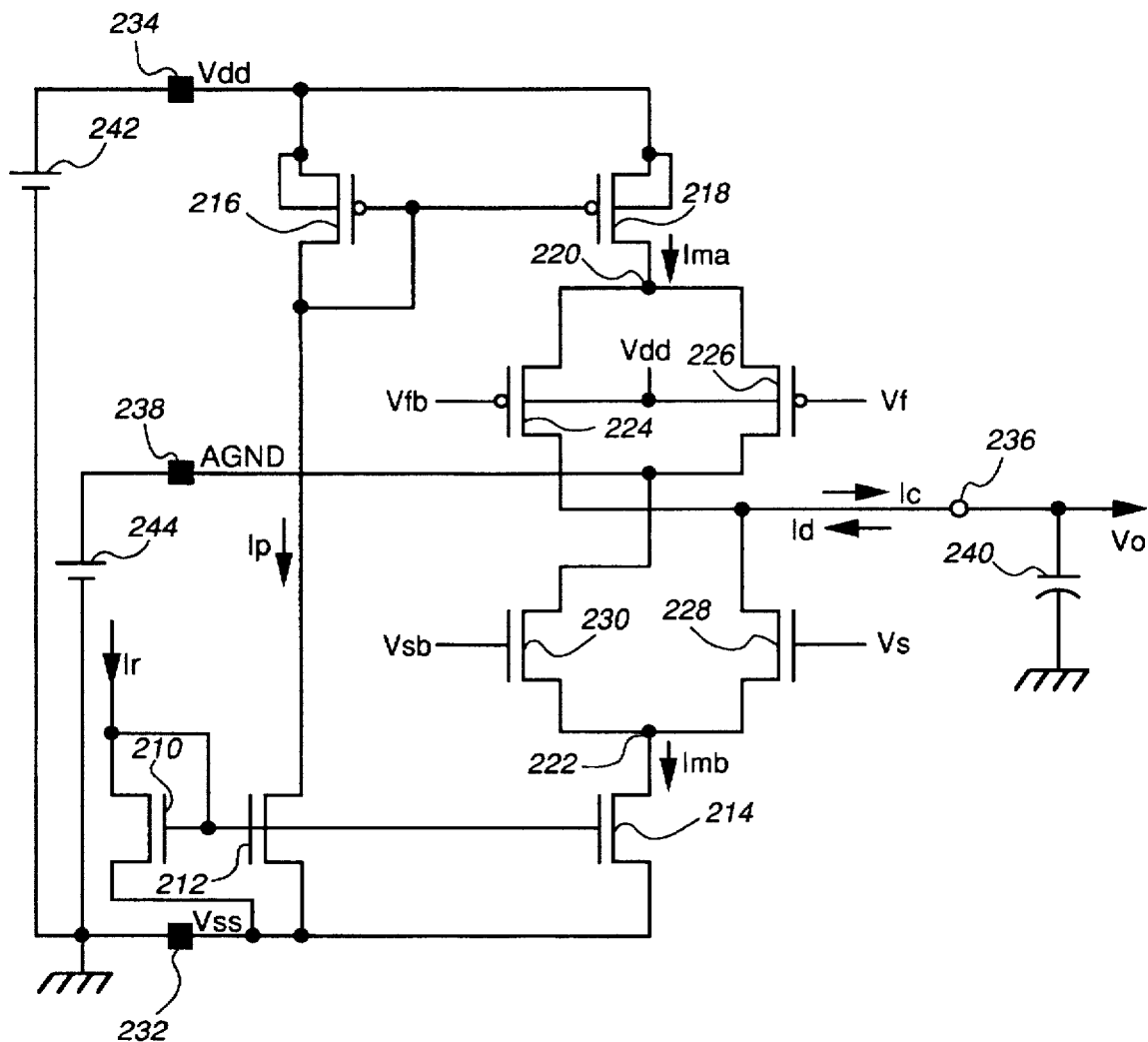
FIG. 2 is a schematic diagram of a charge pump circuit according to an embodiment of the present invention.

A charge pump circuit according to one embodiment of the present invention is shown in FIG. 2. In FIG. 2, an input current Ir is fed from a current source (not shown) to the drain of an N-channel FET 210, the drain and gate of which are connected to each other. The charge pump circuit includes a current source and sink circuit having two N-channel FETs 212 and 214 and two P-channel FETs 216 and 218. The gate of the FET 210 is connected to the gates of the FETs 212 and 214. The drain of the FET 212 is connected to the drain and gate of the FET 216. The gate of the FET 216 is connected to the gate of the FET 218, the drain of which is connected to a current source terminal 220. The drain of the FET 214 is connected to a current sink terminal 222.

The charge pump circuit includes a current steering circuit of two P-channel FETs 224 and 226 and two N-channel FETs 228 and 230 which are cross coupled as complimentary differential pairs. The sources of the FETs 224 and 226 are connected to the current source terminal 220. The drains of the FETs 224 and 226 are connected to the drains of the FETs 228 and 230, respectively, the sources of which are connected to the current sink terminal 222.

The sources of the FETs 210, 212 and 214 are connected to a voltage terminal 232 of lower voltage Vss. The sources of the FETs 216 and 218 and the bodies of the FETs 216, 218, 224 and 226 are connected to another voltage terminal 234 of higher voltage Vdd. The junction of the drains of the FETs 224 and 228 is connected to a load terminal 236. The junction of the drains of the FETs 226 and 230 is connected to another voltage terminal 238 of mid-rail voltage AGND (analog ground). It is assumed that the charge pump circuit is used in a PLL circuit and the load terminal 236 is connected to a VCO (not shown) and an external filter. For the purposes of illustration, a simple capacitor 240 is shown as the filter. The capacitor 240 is connected between the load terminal 236 and the ground terminal and stores the integrated charge. The Vss voltage terminal 232 is connected to the ground terminal (of 0 volts), which is the system ground. The Vdd voltage terminal 234 is connected to a low impedance voltage source 242 of +5.0 volts. The AGND voltage terminal 238 is connected to a low impedance voltage source 244 of +2.5 volts (which is equal to half the difference between Vdd and Vss). Differential voltages Vf and Vfb (inverse of Vf) are fed to the gates of the FETs 226 and 224, respectively. Differential voltages Vs and Vsb (inverse of Vs) are fed to the gates of the FETs 228 and 230, respectively.

The P-channel FETs 216, 218, 224 and 226 have larger W/L (gate size) ratios equal to the difference in channel mobility over the N-channel FETs 210, 212, 214, 228 and 230.

b) Operation of the First Embodiment

In response to the input current Ir fed to the FET 210, a voltage is generated at the gates of the FETs 212 and 214. In response to the voltage, current Ip flows in the series-connected FETs 216 and 212. The FETs 218 and 214 are capable of sourcing nominal current Ima to, and sinking nominal current Imb from, the load including the capacitor 240, each of the currents being the mirrored current of the current Ip. Thus, as a result of output current I (Ic or Id), an output voltage Vo appears across the capacitor 240 and is driven by half of the cross-coupled differential pair. The other half of the cross-coupled pair structure is tied to the mid-rail voltage AGND which is fed by the voltage source 244. The output voltage Vo is used for single-ended operation. The sourcing and sinking current is nominally controlled by the FETs 224–230 in conjunction with the current source and sink circuit. In response to the input current Ir, the current Imb flowing in the FET 214 should be equal to the current Ima flowing in the FET 218 for symmetric charge pumping. The current may be set by the width to length ratios with respect to the FET 210. In the charge pump circuit, to perform the symmetric charge pumping, the FETs 216, 218, 224 and 226 have larger W/L ratios equal to the difference in channel mobility over the FETs 210, 212, 214, 228 and 230.

The differential voltages Vf and Vfb cause the output voltage Vo at the load terminal 236 to increase in a current-source mode. The differential voltages Vs and Vsb cause the output voltage Vo to decrease in a current-sink mode. When neither sourcing-current nor sinking-current is required, the output is tri-stated (float mode).

(i) Tri-State Mode (Float Mode)

In the tri-state mode where the voltages Vf and Vs are "low" and their inverses Vfb and Vsb are "high", the FETs 226 and 230 are turned on fully and the FETs 224 and 228 are turned off. The current Ima flowing in the FET 218 flows through the turned on FETs 226 and 230 to the FET 214, so that the current Imb flowing in the FET 214 is equal to the current Ima. Neither current-sourcing to nor current-sinking from the capacitor 240 takes place.

(ii) Output Increase Mode (Current-Source Mode)

Where the voltage Vo is required to increase, the differential voltages Vf and Vfb are made "high" and "low", respectively, and the other differential voltages Vs and Vsb are made "low" and "high", respectively. The FETs 224 and 230 are turned on. The current Ima flowing in the FET 218 is directed to the load terminal 236 through the on FET 224. Hence, the charge pump circuit sources current Ic (equal to Ima) and it charges the capacitor 240. At the same time, due to the turned on FET 230, current flows from the voltage source 244 to the FET 214 through the FET 230. The current Imb flowing in the FET 214 is equal to the current Ima.

(iii) Output Decrease Mode (Current-Sink Mode)

Where the voltage Vo is required to decrease, the differential voltages Vs and Vsb are made "high" and "low", respectively, and the Other differential voltages Vf and Vfb are made "low" and "high", respectively. The FETs 226 and 228 are turned on and the FETs 224 and 230 are turned off. The current Ima flowing in the FET 218 is directed to the voltage source 244 through the turned on FET 226. Concurrently, due to the turned on FET 228, the charge of the capacitor 240 is reduced and current Id (=Imb) from the capacitor 240 is directed to the FET 214 through the FET 228. The currents Ima and Imb are equal, as long as the charge on the capacitor 240 does not deplete completely.

Current that goes through the voltage terminal 238 of mid-rail voltage AGND must not perturb the potential at the voltage terminal 232 of low voltage Vss. If the low voltage Vss is not sourced with a low impedance, the mid-rail voltage AGND must be referenced to a separate low voltage Vss which is not related to the system ground.

In summary, current always flows in the FETs 218 and 214 in the charge pump circuit, regardless of the current-source mode, the current-sink mode or the tri-state mode. Therefore, change in current in the power supply rails is minimized as the FETs switch from on-state to off-state and vice versa. There will be small transients that may exist because of capacitive feedthroughs. Current flows constantly through the power supply rails, even during the transition period from the sinking current state to the sourcing current state and vice versa. This noise, due to switching transistors, is significantly reduced relative to known charge pump circuits.

II-2. Second Embodiment a) Structure of the Second Embodiment

Figure 3:
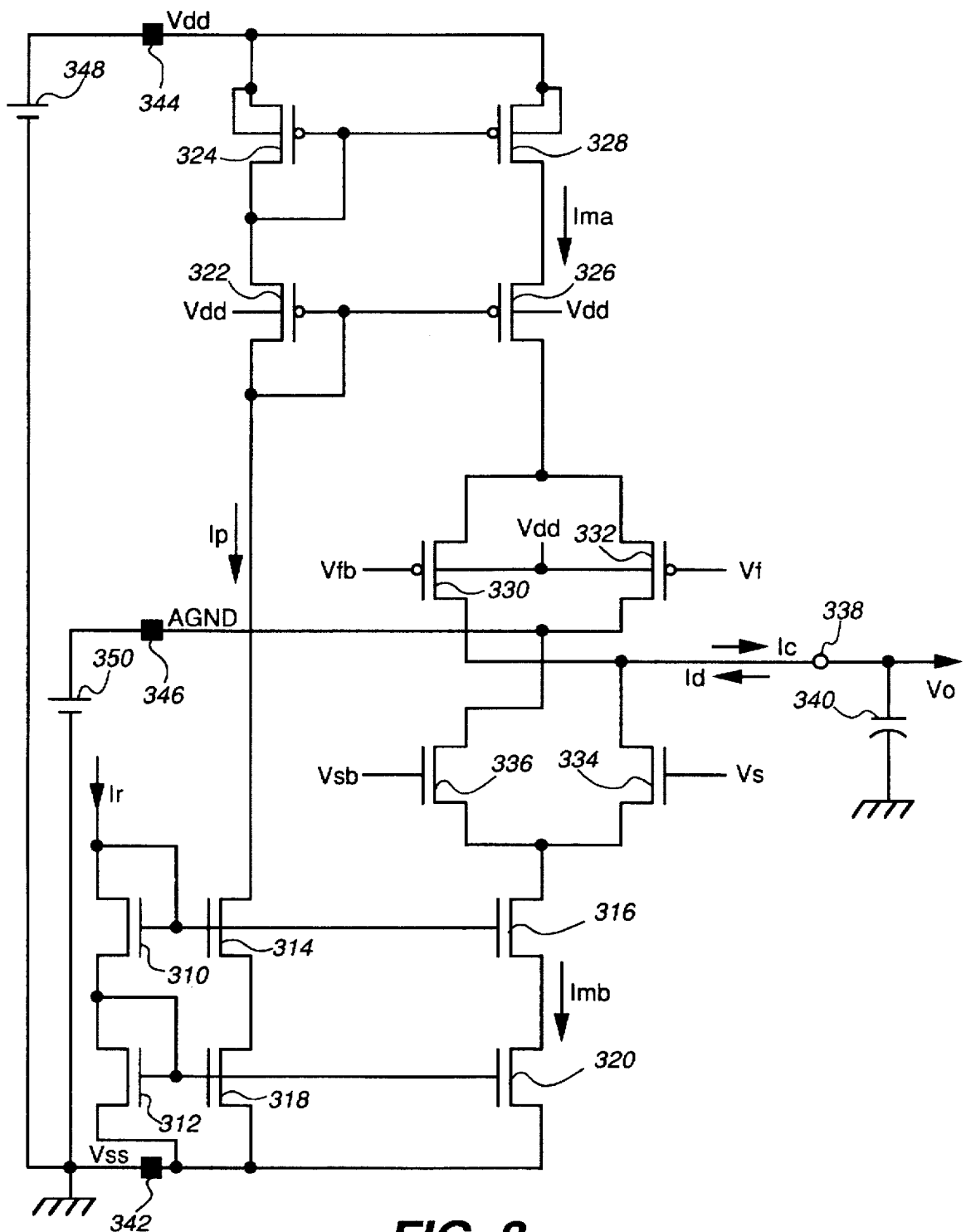
FIG. 3 is a schematic diagram of a charge pump circuit according to another embodiment of the present invention.

FIG. 3 shows a charge pump circuit according to a second embodiment of the present invention. The structure of the second embodiment is similar to that of the first embodiment, but the second embodiment uses current sink and source circuits in cascode configuration. In FIG. 3, an input current Ir is fed from an input circuit (not shown) to the drain of an N-channel FET 310. The source of the FET 310 is connected to the drain of an N-channel FET 312. The gate of the FET 310 is connected to the drain thereof and the gates of N-channel FETs 314 and 316. The gate of the FET 312 is connected to the drain thereof and the gates of N-channel FETs 318 and 320. The sources of the FETs 314 and 316 are connected to the drains of the FETs 318 and 320, respectively. The drain of the FET 314 is connected to the drain and gate of a P-channel FET 322, the source of which is connected to the drain and gate of a P-channel FET 324. The gates of the FETs 322 and 324 are connected to the gates of P-channel FETs 326 and 328, respectively. The source of the FET 326 is connected to the drain of the FET 328. The drain of the FET 326 is connected to the sources of P-channel FETs 330 and 332, the drains of which are connected to the drains of N-channel FETs 334 and 336, respectively. The sources of the FETs 334 and 336 are connected to the drain of the FET 316. The junction of the drains of the FETs 330 and 334 is connected to a load terminal 338 which is connected to an external loop filter. In this circuit, the filter has a capacitor 340. The sources of the FETs 312, 318 and 320 are connected to a voltage terminal 342 of lower voltage Vss. The sources of the FETs 324 and 328 and the bodies of the FETs 322, 324, 326, 328, 330 and 332 are connected to another voltage terminal 344 of higher voltage Vdd. The junction of the drains of the FETs 332 and 336 is connected to another voltage terminal 346 of mid-rail voltage AGND. The Vss voltage terminal 342 is connected to the ground terminal (0 volts). The ground terminal is the system ground. The Vdd voltage terminal 344 is connected to a low impedance voltage source 348 of +5.0 volts. The AGND terminal 346 is connected to a low impedance voltage source 350 of +2.5 volts. Differential control voltages Vf and Vfb are fed to the gates of the FETs 332 and 330, respectively. Differential control voltages Vs and Vsb are fed to the gates of the FETs 334 and 336, respectively.

The charge pump circuit shown in FIG. 3 performs the same function (i.e., current sourcing and sinking) as the circuit shown in FIG. 2. The circuit shown in FIG. 3 improves on power supply noise rejection. If noise exists on the power supply rails, perturbation of the gate-source voltages Vgs and the drain-source voltages Vds of the FETs 328 and 320 will take place, resulting in changes in current flowing therein. By utilizing cascodes (i.e., the series-connected FETs 328 and 326 and the series-connected FETs 316 and 320), the output impedance seen at the drains of the FETs 326 and 316 increase. Due to the increased output impedance, immunity to existing power supply noise is improved.

Although particular embodiments of the present invention have been described in detail, it should be appreciated that numerous variations, modifications, and adaptations may be made without departing from the scope of the present invention as defined in the claims. For example, the channel types of the FETs may inverse. The FETs may be replaced by bipolar transistors. The steering FETs may be substituted by other switching devices. The voltages Vdd, Vss and AGND may vary.

What is claimed is:

1. A charge pump circuit comprising:

first, second and third voltage terminals for receiving first, second and third voltages, respectively, the third voltage being at a level between the first and the second voltages;

current means connected to the first and second voltage terminals and having first and second current terminals, the current means being capable of sourcing current to the first current terminal and sinking current from the second current terminal in response to an input signal;

a load terminal for connection to a load; and current steering means connected to the third voltage terminal, the load terminal, the first current terminal and the second current terminal, the current steering means operable: (i) in a current-source mode, to direct current from the first current terminal to the load terminal and to direct current from the third voltage terminal to the second current terminal; and (ii) in a current-sink mode, to direct current from the load terminal to the second current terminal and to direct current from the first current terminal to the third voltage terminal.

2. The charge pump circuit of claim 1, wherein the current means comprises:

current sourcing means capable of sourcing current to the first current terminal in response to the input signal; and current sinking means capable of sinking current from the second current terminal in response to the input signal.

3. The charge pump circuit of claim 1, wherein the load comprises a capacitive filter circuit.

4. The charge pump circuit of claim 2, wherein:

in the current-source mode, the current sourcing means sources current in response to the input signal; and in the current-sink mode, the current sinking means sinks current in response to the input signal, the sinking current by the current sinking means being equivalent to the current sourced by the current sourcing means.

5. The charge pump circuit of claim 2, wherein:

the current sourced by the current sourcing means is directed to the load terminal and the third voltage terminal by the current steering means in the current-source and the current-sink modes, respectively; and the current sinking means sinks the current from the third voltage terminal and the load terminal directed by the current steering means in the current-source and the current-sink modes, respectively.

6. The charge pump circuit of claim 1, wherein the current means comprises a current mirror circuit which includes:

a first circuit comprising first and second transistors which are connected in series between the first and the second voltage terminals, the first circuit causing current to flow in the series-connected transistors in response to the input signal; and a second circuit comprising third and fourth transistors, the third transistor being connected between the first voltage terminal and the first current terminal, the fourth transistor being connected between the second current terminal and the second voltage terminal, the second circuit being responsive to the current of the first circuit, so that mirrored current flows in the second circuit, the mirrored current being directed to the load terminal or the third voltage terminal by the current steering means.

7. The charge pump circuit of claim 1, wherein the current steering means comprises:

first switch means connected between the first current terminal and the load terminal;

second switch means connected between the first current terminal and the third voltage terminal;

third switch means connected between the third voltage terminal and the second current terminal; and fourth switch means connected between the load terminal and the second current terminal.

8. The charge pump circuit of claim 7, wherein the first and third switch means turn on in the current-source mode and the second and fourth switch means turn on in the current-sink mode.

9. The charge pump circuit of claim 7, wherein the second and third switch means turn on in a float mode, so that the current is directed from the first current terminal to the second current terminal and no current is directed to the load terminal.

10. The charge pump circuit of claim 7, wherein the first and second switch means are turned on or off in response to a first differential signal and the third and fourth switch means are turned on or off in response to a second differential signal.

11. The charge pump circuit of claim 10, wherein:

each of the first to fourth switch means comprises a FET; and each of the first and second differential signals comprises differential voltages, the voltages of the first differential signal are fed to the gates of the FETs of the first and second switch means, and the voltages of the second differential signal are fed to the gates of the FETs of the third and fourth switch means.

12. The charge pump circuit of claim 6, wherein the input signal is input current fed by a current source, and further comprising means for providing a driving signal to the second transistor of the first circuit in response to the input current, so that current flows in the first circuit in response to the driving signal.

13. The charge pump circuit of claim 6, wherein:

the first circuit further comprises fifth and sixth transistors, the first, second, fifth and sixth transistors being connected in series between the first and the second voltage terminals; and the second circuit further comprises seventh and eighth transistors, the third and seventh transistors being connected in series between the first voltage terminal and the first current terminal, the fourth and eighth transistors being connected in series between the second current terminal and the second voltage terminal.

14. The charge pump circuit of claim 13, wherein the input signal is input current fed by a current source, and further comprising means for providing driving signals to the second, fourth, sixth and eighth transistors.

15. The charge pump circuit of claim 6, wherein the first and the third transistors are FETs of a first channel type and the second and the fourth transistors are FETs of a second channel type.

16. The charge pump circuit of claim 7, wherein the FETs of the first and second switch means are of a first channel type and the FETs of the third and fourth switch means are of a second channel type.

17. The charge pump circuit of claim 13, wherein the fifth and seventh transistors are FETs of a first channel type and the sixth and eighth transistors are FETs of a second channel type.

18. The charge pump circuit of claim 15, 16 or 17, wherein the first and second channel types are P-channel and N-channel, respectively.

19. The charge pump circuit of claim 18, wherein the P-channel FETs have larger gate size ratios equal to the difference in channel mobility over the N-channel FETs.

20. The charge pump circuit of claim 1, wherein the third voltage is a mid-rail voltage of the first and second voltages.

* * * * *